(12) United States Patent
Ifuku et al.

(10) Patent No.: US 7,517,063 B2
(45) Date of Patent: Apr. 14, 2009

(54) PIEZOELECTRIC ELEMENT

(75) Inventors: Toshihiro Ifuku, Kanagawa (JP);
Kenichi Takeda, Kanagawa (JP);
Tetsuro Fukui, Kanagawa (JP);
Katsumi Aoki, Kanagawa (JP);
Takanori Matsuda, Kanagawa (JP);
Masaru Shimizu, 1-7-506, Higashi
Tsujii 4-chome, Himeji-shi, Hyogo-ken
(JP)

(73) Assignees: Canon Kabushiki Kaisha, Tokyo (JP);
Masaru Shimizu, Himeji-shi (JP)

( * ) Notice: Subject to any disclaimer, the term of this patent is extended or adjusted under 35 U.S.C. 154(b) by 246 days.

(21) Appl. No.: 11/491,027

(22) Filed: Jul. 24, 2006

(65) Prior Publication Data

US 2006/0256167 A1   Nov. 16, 2006

Related U.S. Application Data (62) Division of application No. 10/532,020, filed as application No. PCT/JP2004/000964 on Jan. 30, 2004, now Pat. No. 7,144,101.

(30) Foreign Application Priority Data

Jan. 31, 2003   (JP) .............................. 2003-024452

(51) Int. Cl.
*B41J 2/045* (2006.01)
(52) U.S. Cl. ....................................................... 347/68
(58) Field of Classification Search ................ 347/71, 347/72, 68; 257/646; 600/459; 29/25.35
See application file for complete search history.

(56) References Cited

U.S. PATENT DOCUMENTS 5,402,791 A * 4/1995 Saitoh et al. ................ 600/459

| | | |
|---|---|---|
| 5,936,329 A | 8/1999 | Shibata et al. |
| 6,338,551 B1 | 1/2002 | Sugiura et al. |
| 6,387,476 B1 | 5/2002 | Iwasaki et al. |
| 6,653,211 B2 | 11/2003 | Unno et al. |
| 6,854,832 B2 | 2/2005 | Matsuda |
| 6,927,084 B2 | 8/2005 | Fukui et al. |
| 7,120,978 B2 | 10/2006 | Wasa et al. |
| 2002/0076875 A1 | 6/2002 | Wasa et al. |
| 2002/0140320 A1 | 10/2002 | Unno et al. |
| 2004/0066116 A1 | 4/2004 | Matsuda et al. |
| 2004/0155559 A1 | 8/2004 | Ifuku et al. |

(Continued)

FOREIGN PATENT DOCUMENTS

| CN | 1338377 A | 3/2002 |
|---|---|---|
| JP | 10-251093 | 9/1998 |
| JP | 2001-328867 | 11/2001 |
| WO | WO 97/03472 | 1/1997 |

OTHER PUBLICATIONS

Chinese Office Action dated Aug. 17, 2007, issued in corresponding Chinese patent application No. 200480003112.7, with English-language translation.
*Ceramic Yudentai Kogaku*, Gakken-sha, 4th edition, p. 333 (with partial English translation).

*Primary Examiner*—K. Feggins
(74) *Attorney, Agent, or Firm*—Fitzpatrick, Cella, Harper & Scinto (57) ABSTRACT

A piezoelectric element including an upper electrode, a piezoelectric and/or electrostrictive material and a lower electrode, characterized in that the piezoelectric and/or electrostrictive material is a composite oxide constituted by $ABO_3$ as general formula and the piezoelectric and/or electrostrictive material has a twin crystal.

8 Claims, 5 Drawing Sheets

U.S. PATENT DOCUMENTS

| | | |
|---|---|---|
| 2004/0207695 A1 | 10/2004 | Aoto et al. |
| 2005/0127780 A1 | 6/2005 | Ifuku et al. |
| 2005/0168112 A1 | 8/2005 | Aoki et al. |
| 2005/0189849 A1 | 9/2005 | Ifuku et al. |
| 2005/0219793 A1 | 10/2005 | Matsuda et al. |
| 2006/0033404 A1 | 2/2006 | Fukui et al. |
| 2006/0046319 A1 | 3/2006 | Takeda |
| 2006/0049135 A1 | 3/2006 | Okabe et al. |

* cited by examiner

PIEZOELECTRIC ELEMENT

This is a divisional application of application Ser. No. 10/532,020, filed on Apr. 20, 2005.

TECHNICAL FIELD

The present invention relates to a piezoelectric element and a piezoelectric actuator, and more particularly to an ink jet recording head for use in an ink jet recording apparatus.

BACKGROUND ART

Recently, a piezoelectric actuator is attracting attention in the field of portable information equipment, chemical industry and medical field as a novel motor in place for an electromagnetic motor, as it can achieve a miniaturization and a high density in motors. Also the piezoelectric actuator in its drive does not generate electromagnetic noises nor is affected by noises. Furthermore, the piezoelectric actuator is attracting attention as a technology for producing an equipment of submillimeter dimension as represented by a micromachine, and a small piezoelectric actuator is desired as a drive source for such micromachines.

A prior piezoelectric element is generally composed of a piezoelectric member, formed by working a bulk sintered member and provided in a predetermined position on a substrate such as of a metal or silicon. The piezoelectric member is obtained by polishing a bulk sintered member into desired size and thickness, or obtained by punching from a green sheet, followed by a heat treatment. Such bulk sintered member or a molded member from the green sheet generally has a thickness of several micrometers or larger. Such piezoelectric actuator generally has a basic structure in which a piezoelectric member and an elastic material are adhered with an adhesive material.

On the other hand, in addition to the adhesion with the adhesive material, there is known a method of forming a piezoelectric member directly on a substrate for example by sputtering or printing method. Usually the piezoelectric member formed by a printing method, a sputtering method, an MOCVD method, a sol-gel method or a gas deposition method has a thickness of about several tens of nanometers (several hundred Angstroms) to several hundred micrometers. Also in either structure, the piezoelectric member is provided with electrodes through which a voltage is applied.

As explained in the foregoing, the piezoelectric element basically has a structure in which a piezoelectric element and a substrate are adhered with an adhesive material, or a structure in which a piezoelectric member is directly formed on a substrate.

An ink jet recording apparatus utilizing such piezoelectric element is formed by a pressure chamber communicating with an ink supply chamber, and an ink discharge port communicating with the pressure chamber, wherein such pressure chamber is provided with a vibrating plate on which a piezoelectric element is adjoined or directly formed. In such configuration, a predetermined voltage is applied to the piezoelectric element to cause an elongation or a contraction therein, thereby inducing a bending vibration to compress ink in the pressure chamber and to discharge a droplet of ink liquid from the ink discharge port. Such function is currently utilized in a color ink jet recording apparatus, but there is being desired an improvement in the printing performance, particularly a higher resolution and a higher printing speed. For this purpose, there is being tried a multi nozzle head structure with a miniaturized ink jet head structure for achieving a higher resolution and a higher printing speed. For miniaturizing an ink jet head, it is necessary to compactize a piezoelectric element for discharging the ink.

Such compact piezoelectric element has been produced by a fine structuring of a sintered piezoelectric member for example by cutting and polishing as explained above, but, there is also being investigated to produce an ultra compact piezoelectric element of a high precision by forming the piezoelectric member as a thin film and utilizing a fine working technology developed in the semiconductor industry. Also for achieving a higher performance, the piezoelectric member is preferably formed by a single crystal film or a single oriented film, and a hetero epitaxial growing technology is being actively developed.

On the other hand, a ferroelectric material of perovskite structure, represented by a general formula $ABO_3$, is recently attracting attention as a piezoelectric material. Such material, as represented by PZT, is excellent in a ferroelectric property, a pyroelectric property and a piezoelectric property. Also a relaxer type electrostrictive material represented by PZN-PT is expected as a piezoelectric material because of its excellent piezoelectric property. The PZT material is explained for example in "Ceramic Yudentai Kogaku" (Gakken-sha, 4th edition), p. 333. Also the relaxer material is described for example in Japanese Patent Application Laid-open No. 2001-328867.

However, it has been found out that even the material having the aforementioned high piezoelectric property cannot realize the piezoelectric property of the expected high level, and that even the piezoelectric and/or electrostrictive material which has an orientation property or is formed by a single crystal and for which a higher piezoelectric property is expected only gives rise, by a mere increase in the crystallinity, to a piezoelectric property not different from that in a piezoelectric and/or electrostrictive material which does not have an orientation property or is not formed by a single crystal. Also there has not been established a piezoelectric element capable of avoiding an electrode peeling of the piezoelectric element, principally resulting from a large piezoelectric strain and encountered when the piezoelectric property is increased, or a film peeling encountered in case of direct formation of the piezoelectric element on the substrate.

DISCLOSURE OF THE INVENTION

An object of the present invention is to provide a piezoelectric element provided with a piezoelectric and/or electrostrictive material with excellent piezoelectric property. Another object of the present invention is to provide a piezoelectric element having satisfactory adhesion between a piezoelectric and/or electrostrictive material and a lower or upper electrode. Still another object of the present invention is to prevent a film peeling in case of forming a piezoelectric element directly on a substrate. Still another object of the present invention is to provide a piezoelectric actuator and an ink jet recording head of a high reliability.

[1] In order to attain the aforementioned objectives, the piezoelectric element of the present invention is characterized in including an upper electrode, a piezoelectric and/or electrostrictive material, and a lower electrode, wherein the piezoelectric and/or electrostrictive material is a composite oxide constituted by $ABO_3$ as general formula, and the piezoelectric and/or electrostrictive material has a twin crystal.

As a result of intensive investigation, the present inventors have found that presence of a twin crystal in the piezoelectric and/or electrostrictive material allows to obtain a piezoelectric element with an improved piezoelectric property and an improved adhesion between the piezoelectric and/or electrostrictive material and the lower or upper electrode.

A reason therefor is not clear, but it is estimated that the presence of a twin crystal in the piezoelectric and/or electrostrictive material relaxes an internal stress, generated at the preparation of the material by various methods, thereby exhibiting the piezoelectric property inherent to the material itself providing a satisfactory adhesion between the piezoelectric and/or electrostrictive material and the lower or upper electrode.

In the present invention, a twin means a crystal structure in which two or more crystals of a same piezoelectric and/or electrostrictive material are adjoined and integrated in a symmetrical relationship with respect to a plane or an axis, and a twin crystal having a twin crystal domain boundary at such plane or axis.

[2] The aforementioned objects can be attained by a piezoelectric element according to [1], wherein a twin plane of the twin crystal is one selected from a group represented by {110}.

{110} collectively represents six planes generally represented by (110), (101), (011) etc. Also a twin plane indicates {110} in case ions at lattice points on both sides of {110} are in a mirror image relationship.

[3] The aforementioned objects can be attained by a piezoelectric element according to [1], wherein a twin plane of the twin crystal is one selected from a group represented by {100}.

{100} collectively represents six planes generally represented by (100), (010), (001) etc. Also a twin plane indicates {100} in case ions at lattice points on both sides of {100} are in a mirror image relationship.

the piezoelectric and/or electrostrictive material has a tetragonal system.

Though a reason why the presence of such twin crystal contributes to an improvement in the piezoelectric and/or electrostrictive material or an improvement in the adhesion between the piezoelectric and/or electrostrictive material and the lower or upper electrode is not yet clear, it is estimated, for example, that [100] of a twin domain having a twin plane (101) generally forms an angle of only several degrees of less with respect to [001] constituting a polarizing axis direction of the piezoelectric and/or electrostrictive material of a tetragonal system, whereby the twin domain contributes to relax the internal stress without significantly damaging the inherent structure of the piezoelectric and/or electrostrictive material, thereby exhibiting the piezoelectric property inherent to the material and improving the adhesion between the piezoelectric and/or electrostrictive material and the lower or upper electrode, or that a switching of a twin domain or a displacement of a domain wall under a voltage application allows an easy distortion of the lattice thereby exhibiting a large piezoelectric property.

[5] The aforementioned objectives can be attained by a piezoelectric element according to [2] wherein the piezoelectric and/or electrostrictive material has a rhombic system.

Though a reason why the presence of such twin crystal (twin crystal) contributes to an improvement in the piezoelectric and/or electrostrictive material or an improvement in the adhesion between the piezoelectric and/or electrostrictive material and the lower or upper electrode is not yet clear, it is estimated, for example, that [101] of a twin domain having a twin plane (110) generally forms an angle of only several degrees of less with respect to [011] constituting a polarizing axis direction of the piezoelectric and/or electrostrictive material of a rhombic system, whereby the twin domain contributes to relax the internal stress without significantly damaging the inherent structure of the piezoelectric and/or electrostrictive material, thereby exhibiting the piezoelectric property inherent to the material and improving the adhesion between the piezoelectric and/or electrostrictive material and the lower or upper electrode, or that a switching of a twin domain or a displacement of a domain wall under a voltage application allows an easy distortion of the lattice thereby exhibiting a large piezoelectric property.

[6] The aforementioned objectives can be attained by a piezoelectric element according to [3] wherein the piezoelectric and/or electrostrictive material has a rhombohedral system.

Though a reason why the presence of such twin crystal contributes to an improvement in the piezoelectric and/or electrostrictive material or an improvement in the adhesion between the piezoelectric and/or electrostrictive material and the lower or upper electrode is not yet clear, it is estimated, for example, that [−111] of a twin domain having a twin plane (100) generally forms an angle of only several degrees of less with respect to [111] constituting a polarizing axis direction of the piezoelectric and/or electrostrictive material of a rhombohedral system, whereby the twin domain contributes to relax the internal stress without significantly damaging the inherent structure of the piezoelectric and/or electrostrictive material, thereby exhibiting the piezoelectric property inherent to the material and improving the adhesion between the piezoelectric and/or electrostrictive material and the lower or upper electrode, or that a switching of a twin domain or a displacement of a domain wall under a voltage application allows an easy distortion of the lattice thereby exhibiting a large piezoelectric property.

[7] The aforementioned objectives can be attained by a piezoelectric element according to any one of [1] to [6], wherein the piezoelectric and/or electrostrictive material has a twin crystal rate from 0.001 to 1.0. A piezoelectric and/or electrostrictive material of such twin crystal rate causes a relaxation of the internal stress, thereby exhibiting a piezoelectric property inherent to the material and improving the adhesion between the piezoelectric and/or electrostrictive material and the lower or upper electrode.

In the present invention, a twin crystal rate means a proportion of the twin crystal domain in the crystal, in the piezoelectric and/or electrostrictive material, and the presence of twin crystal or the twin crystal rate can be confirmed for example by a high resolution TEM or an X-ray diffraction.

[8] The aforementioned objectives can be attained by a piezoelectric element according to any one of [1] to [7], wherein the piezoelectric and/or electrostrictive material has an orientation property.

[9] The aforementioned objectives can be attained by a piezoelectric element according to [8], wherein the piezoelectric and/or electrostrictive material has an orientation rate of 99% or higher in a direction of at least an axis.

It is considered that a piezoelectric and/or electrostrictive material having an orientation property or being a single crystal generally shows a high piezoelectric property, but by a simple increase in the crystallinity, the piezoelectric property cannot reach an anticipated high level but remains same as that in a piezoelectric and/or electrostrictive material without such orientation property or single crystalline property.

On the other hand, a piezoelectric element showing a high piezoelectric property can be obtained in case a piezoelectric and/or electrostrictive material of a twin crystal structure has an orientation property. Also in a piezoelectric and/or electrostrictive material having an orientation property or being a single crystal, the adhesion to the lower or upper electrode becomes inferior to that of a film without orientation, but, in case the piezoelectric and/or electrostrictive material having a twin crystal structure has an orientation property, there can in fact be obtained a piezoelectric element with satisfactory adhesion with the lower or upper electrode.

Such orientation property may be an orientation along an axis, or an orientation along all the axes. In the piezoelectric and/or electrostrictive material, there is preferred an orientation property as high as possible, and most preferably all the axes have an orientation property with an orientation rate of 100%.

In the present invention, an orientation rate means a proportion of crystal grains having a same direction along at least an axis, among all the crystal grains in the piezoelectric and/or electrostrictive material, and the presence of an orientation property or an orientation rate can be confirmed for example by a high resolution TEM or an X-ray diffraction.

[10] The aforementioned objectives can be attained by a piezoelectric element according to [8] or [9] wherein the piezoelectric and/or electrostrictive material has a principal crystal plane of {100} in contact with the upper electrode.

[11] The aforementioned objectives can be attained by a piezoelectric element according to [8] or [9] wherein the piezoelectric and/or electrostrictive material has a principal crystal plane of {111} in contact with the upper electrode.

[12] The aforementioned objectives can be attained by a piezoelectric element according to [8] or [9] wherein the piezoelectric and/or electrostrictive material has a principal crystal plane of {110} in contact with the upper electrode.

A principal crystal plane means a principal crystal plane of a piezoelectric and/or electrostrictive material having an orientation property, in a plane in contact with a different phase, and, for example, the principal crystal plane is (001) in case of a [001] orientation.

[13] The aforementioned objectives can be attained by a piezoelectric element according to any one of [1] to [12], wherein the lower electrode and the piezoelectric and/or electrostrictive material are formed directly on the substrate.

In case the piezoelectric and/or electrostrictive material is formed directly on the substrate, a film peeling between the piezoelectric and/or electrostrictive material and the lower electrode or the substrate becomes an issue, but, a piezoelectric and/or electrostrictive material having a twin crystal structure can in fact provide a piezoelectric element of satisfactory adhesion to the lower or upper electrode and to the substrate. Furthermore, a piezoelectric element formed directly on the substrate is adapted for achieving a miniaturization and a high density because the piezoelectric and/or electrostrictive material can be made thin.

[14] The aforementioned objectives can be attained by a piezoelectric element according to [13], wherein a layer including a piezoelectric and/or electrostrictive material is formed with a thickness from 1 to 10 µm.

In case the piezoelectric and/or electrostrictive material has a twin crystal, a film thickness of 1 µm or larger is preferred in order to improve the piezoelectric property. Also in case of forming a piezoelectric and/or electrostrictive material directly on a substrate, a film peeling may become an issue at a film thickness of 1 µm or larger, but the piezoelectric element of the present invention can prevent the film peeling even at a film thickness of 1 µm or larger.

[15] The aforementioned objectives can be attained by a piezoelectric actuator employing a piezoelectric element according to any one of [1] to [13].

The piezoelectric actuator of the present invention is provided with a piezoelectric element of an excellent piezoelectric property. Also the piezoelectric actuator of the present invention is provided with a piezoelectric element showing a satisfactory adhesion between a piezoelectric and/or electrostrictive material and a lower or upper electrode. Furthermore, the piezoelectric actuator of the present invention is provided with a piezoelectric element free from film peeling at a direct formation of a piezoelectric element on a substrate. It is therefore possible to obtain a highly reliable piezoelectric actuator capable of easily attaining a smaller size and a higher function in the piezoelectric element, thereby obtaining a micromachine or a microsensor of a high performance.

[16] The aforementioned objectives can be attained by an ink jet recording head employing a piezoelectric element according to any one of [1] to [14].

The ink jet recording head of the present invention is provided with a piezoelectric element of an excellent piezoelectric property. Also the ink jet recording head of the present invention is provided with a piezoelectric element showing a satisfactory adhesion between a piezoelectric and/or electrostrictive material and a lower or upper electrode. Furthermore, the ink jet recording head of the present invention is provided with a piezoelectric element free from film peeling at a direct formation of a piezoelectric element on a substrate. It is therefore possible to obtain a highly reliable ink jet recording head capable of easily attaining a smaller size and a higher function in the piezoelectric element, thereby enabling fine and precise ink droplet control in various fields.

According to the present invention, there can be obtained a piezoelectric element including an upper electrode, a piezoelectric and/or electrostrictive material and a lower electrode, wherein the piezoelectric and/or electrostrictive material has a twin crystal to relax an internal stress of the piezoelectric and/or electrostrictive material, thereby showing a high piezoelectric property. There can also be obtained a piezoelectric element including an upper electrode, a piezoelectric and/or electrostrictive material and a lower electrode, wherein the piezoelectric and/or electrostrictive material has a twin crystal, thereby showing a satisfactory adhesion between the piezoelectric and/or electrostrictive material and the lower or upper electrode. Furthermore, there can be obtained a piezoelectric element including an upper electrode, a piezoelectric and/or electrostrictive material and a lower electrode, wherein, in case of forming the lower electrode or the piezoelectric and/or electrostrictive material directly on the substrate, the piezoelectric and/or electrostrictive material has a twin crystal, thereby preventing a film peeling at the direct formation of the piezoelectric element on the substrate. Also there can be obtained a piezoelectric actuator or an ink jet recording head of a high reliability, utilizing a piezoelectric element including an upper electrode, a piezoelectric and/or electrostrictive material and a lower electrode, wherein the piezoelectric and/or electrostrictive material has a twin crystal.

BEST MODE FOR CARRYING OUT THE INVENTION

Now embodiments of the present invention will be explained with reference to accompanying drawings.

Figure 1:
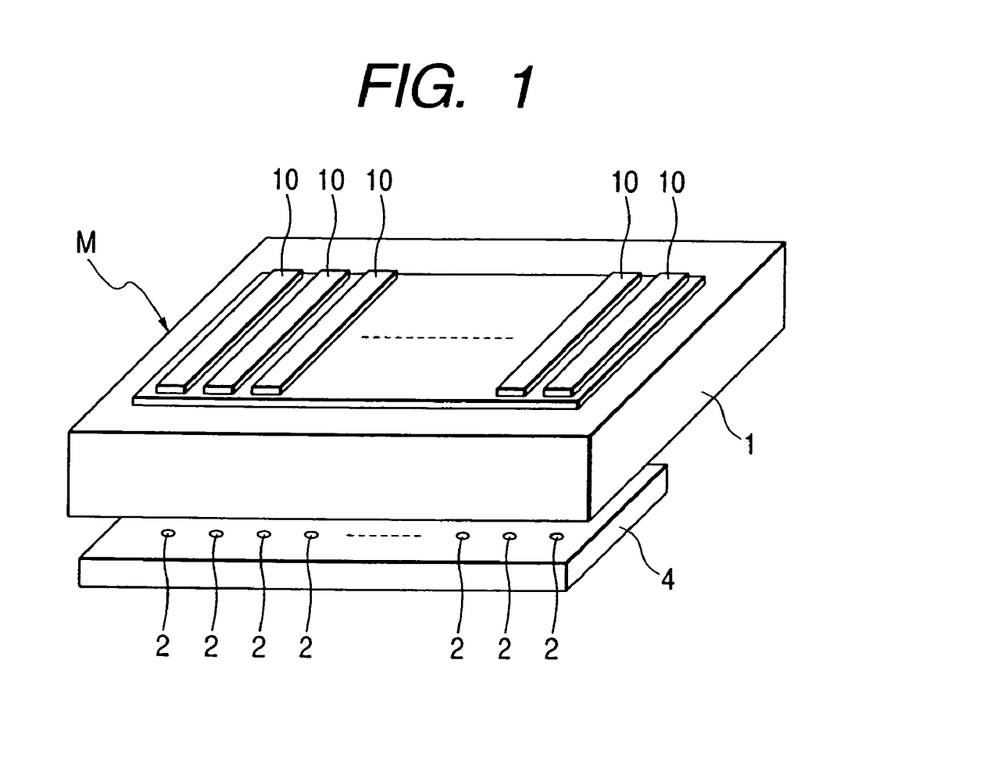
FIG. 1 is a perspective view showing a liquid discharge head in an embodiment.
Figure 2:
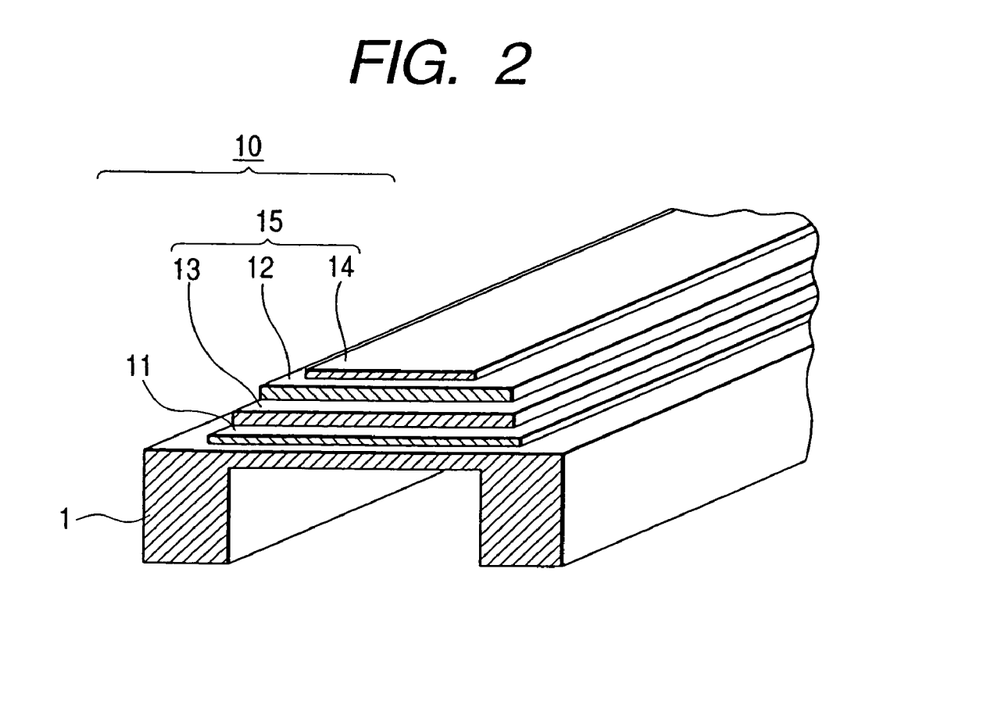
FIG. 2 is a schematic view showing configuration of a piezoelectric actuator in the apparatus shown in FIG. 1.
Figure 3:
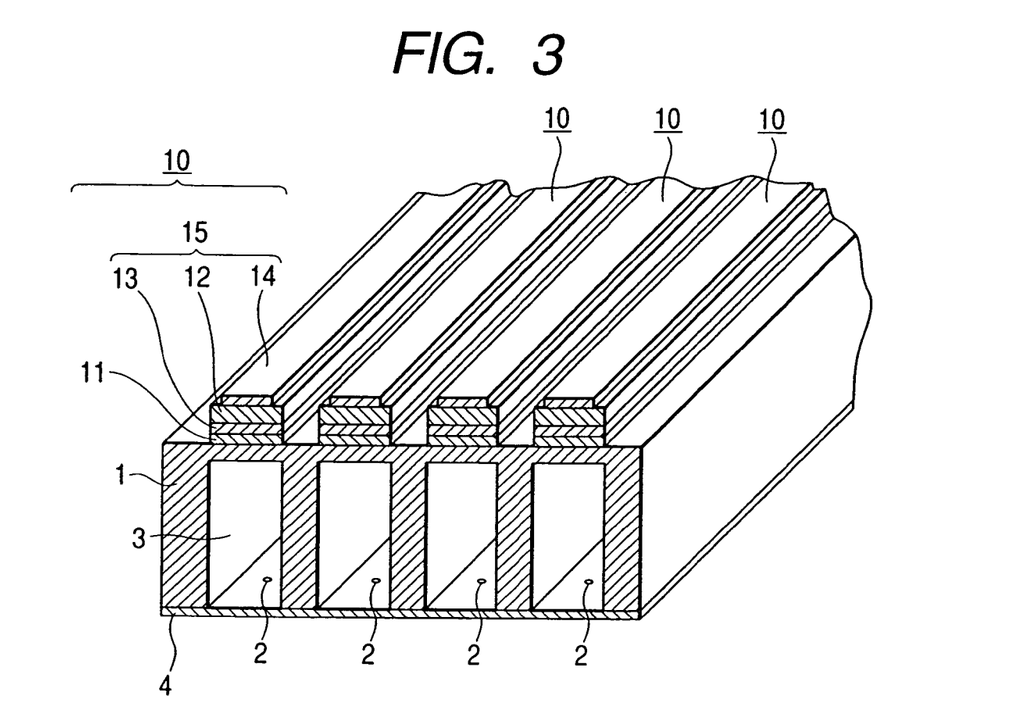
FIG. 3 is a partially cut-off partial perspective view showing a cross sectional structure of the liquid discharge head shown in FIG. 1.

FIGS. 1 to 3 show an ink jet recording head of an embodiment, wherein the ink jet recording head M is constituted of a main body substrate 1 constituting a substrate, plural liquid discharge ports (nozzles) 2, plural pressure chambers (liquid chambers) 3 respectively corresponding to the liquid discharge ports 2, and an actuator 10 provided corresponding to each pressure chamber 3, and the liquid discharge ports 2 are formed with a predetermined pitch on a nozzle plate 4 while the pressure chambers 3 are formed in parallel on the main body substrate (liquid chamber substrate) 1 so as to respectively correspond to the liquid discharge ports 2.

In the present embodiment, the liquid discharge ports 2 are formed on a lower surface, but they may also be formed on a lateral surface.

On an upper surface of the main body substrate 1, an unrepresented aperture is formed corresponding to each pressure chamber 3, and each actuator 10 is so positioned as to close such aperture and is constituted of a vibrating plate 11 and a piezoelectric element 15, which is formed by a piezoelectric and/or electrostrictive material and a pair of electrodes (lower electrode 13 and upper electrode 14).

The piezoelectric and/or electrostrictive material of the present invention is not particularly restricted, and can be any material capable of constituting the piezoelectric element of the present invention, and preferred specific examples of such material include PZT [$Pb(Zr_xTi_{1-x})O_3$], PMN [$Pb(Mg_xNb_{1-x})O_3$], PNN [$Pb(Nb_xNi_{1-x})O_3$], PSN [$Pb(Sc_xNb_{1-x})O_3$], PZN [$Pb(Zr_xNb_{1-x})O_3$], PMN-PT [$(1-y)[Pb(Mg_xNb_{1-x})O_3]$-$y[PbTiO_3]$], PSN-PT [$(1-y)[Pb(Sc_xNb_{1-x})O_3]$-$y[PbTiO_3]$], PZN-PT [$(1-y)[Pb(Zn_xNb_{1-x})O_3]$-$y[PbTiO_3]$] etc. For example PZT is a representative perovskite piezoelectric material, and PZN-PT and PMN-PT are representative relaxer electrostrictive material. In the foregoing, each of x and y is a number from 1 to 0. For example such material may have a crystal phase boundary called MPB, and is generally known to have a satisfactory piezoelectric property in an MPB region. In the MPB region, x is preferably within a range of 0.4 to 0.65 for PZT, 0.2 to 0.5 for PMN and 0.4 to 0.7 for PSN, and y is preferably within a range of 0.2 to 0.4 for PMN-PT, 0.35 to 0.5 for PSN-PT and 0.03 to 0.35 for PZN-PT.

Also the piezoelectric and/or electrostrictive material of the present invention may be a material not based on lead so far as the piezoelectric and/or electrostrictive material is a composite oxide constituted by $ABO_3$ or $AB_2O_3$ as general formula, for example BTO (barium titanate), SBN (strontium barium niobate), KNO (potassium niobate), LNO (lithium niobate) or a bismuth-based berovskite compound (for example, BNT (bismuth sodium titanate). These material can be classified for example into a lead-based material, a non-lead-based material, a piezoelectric material, an electrostrictive material etc., but, because the piezoelectric property is largest in a lead-based relaxer type electrostrictive material, it is particularly preferable to select for example PZN-PT or PMN-PT. It is also possible to select PMN-PZT, PZN-PZT, PNN-PZT or PSN-PZT containing Zr in place for Ti in PMN-PT, PZN-PT, PNN-PT or PSN-PT.

Also the piezoelectric and/or electrostrictive material of the present invention may have a single composition or a combination of two or more kinds. Also there may be employed a composition obtained by doping the aforementioned main components with a trace element, of which representative example is La-doped PZT or PLZT [$(Pb, La)(Z, Ti)O_3$]. As stated above, the piezoelectric and/or electrostrictive material of the present invention is not limited to particular material. Preferably, the piezoelectric and/or electrostrictive material may be a composite oxide constituted by $ABO_3$ as general formula.

The piezoelectric and/or electrostrictive material is not limited in a forming method, but is often formed by subjecting a piezoelectric and/or electrostrictive material, prepared for example by a flux method, a drawing method, or a Bridgman method, to a polishing for obtaining desired size and thickness, or by punching and heat treating a green sheet. Such molded member generally has a thickness of about 100 μm or larger. A piezoelectric actuator prepared with such piezoelectric element has a basic structure in which the piezoelectric element and an elastic material such as the substrate are adhered with an adhesive material or by various adhering methods.

On the other hand, in case of a molded member of 100 μm or less, it is preferable, in addition to the aforementioned methods, to directly form the lower electrode 13 and the piezoelectric and/or electrostrictive material on the substrate for example by a printing method. In such case a pattern formation is preferably executed after the formation of the piezoelectric element. Also for a thin film of a thickness of 10 μm or less, there is generally employed a film forming method such as a sol-gel method, a hydrothermal synthesis method, a gas deposition method or an electrophoresis method, and there is also preferably employed a sputtering method, a CVD method, an MOCVD method, an ion beam deposition method, a molecular beam epitaxy method or a laser ablation method. In such film forming methods, since a higher orientation can be attained in the piezoelectric and/or electrostrictive material by an epitaxial growth from the substrate or the lower electrode, it is possible to form a piezoelectric element of a further elevated piezoelectric property.

It is preferred that the upper or lower electrode to be employed in the piezoelectric element of the present invention has a satisfactory adhesion with the aforementioned piezoelectric and/or electrostrictive material and has a high electrical conductivity, and more specifically the upper or lower electrode preferably has a specific resistivity of $10^{-7}$ to $10^{-2}$ Ω·cm. Such material is generally a metal, and there is often utilized, as the electrode, for example Au, Ag, Cu or a metal of Pt group such as Ru, Rh, Pd, Os, Ir or Pt. Also an alloy containing such material, for example a silver paste or a solder, has a high conductivity and is preferably employed for element formation. As the electrode material, there is also preferably employed a conductive oxide such as IrO (iridium oxide), SRO (strontium ruthenate), ITO (conductive tin oxide) or BPO (barium plumbate).

The lower electrode has a thickness of 10 to 2000 nm, preferably 100 to 1000 nm. The material constituting the lower electrode is not particularly limited in a forming method, and it is possible, for example, to directly form the lower electrode on or under the piezoelectric and/or electrostrictive material by a printing method, or to directly form the lower electrode on a substrate or a vibrating plate by a printing method. Also in case the piezoelectric and/or electrostrictive material is a thin film of 10 μm or less, it is preferable to form the lower electrode directly on the substrate or the vibrating plate by a film forming method such as a sol-gel method, a hydrothermal synthesis method, a gas deposition method or an electrophoresis method, or a vacuum film forming method such as a sputtering method, a CVD method, an MOCVD method, an ion beam deposition method, a molecular beam epitasy method or a laser ablation method. Since such film forming methods allow to achieve a single crystal structure and a high orientation in the lower electrode, utilizing an epitaxy growth from the substrate or the vibrating plate, it is rendered possible to form a piezoelectric element of a further higher piezoelectric property. Also the upper electrode may be formed suitably according to the film thickness.

Furthermore, between the lower electrode and the vibrating plate, a metal material or a metal oxide material different from the lower electrode may be formed as an adhesion layer. The adhesion layer may be constituted, in case of a metal, for example of Ti, Cr or Ir, or in case of a metal oxide, of $TiO_2$ or $IrO_2$. The adhesion layer has a thickness of 3 to 300 nm, preferably 3 to 70 nm. A similar adhesion layer may also be provided between the piezoelectric and/or electrostrictive material and the upper electrode.

Presence of a twin crystal in the piezoelectric and/or electrostrictive material allows to improve the piezoelectric property and to obtain a piezoelectric element with a satisfactory adhesion between the piezoelectric and/or electrostrictive material and the lower or upper electrode.

It is particularly preferable that the piezoelectric and/or electrostrictive material has a tetragonal crystal structure and a twin crystal plane (101) in the twin crystal. Otherwise it is likewise preferable that the piezoelectric and/or electrostrictive material has a rhombohedral crystal structure and a twin crystal plane (100) in the twin crystal. Otherwise it is likewise preferable that the piezoelectric and/or electrostrictive material has a rhombic crystal structure and a twin crystal plane (110) in the twin crystal.

In the foregoing, there have been shown three examples, but any other twin crystal having a crystal axis within several degrees from the polarizing axis likewise contributes to an improvement in the piezoelectric property of the piezoelectric and/or electrostrictive material and in the adhesion between the piezoelectric and/or electrostrictive material and the lower or upper electrode, and also in other crystalline systems such as a hexagonal or pseudo tetragonal system, any twin crystal having a crystal axis within several degrees from the polarizing axis can contribute to an improvement in the piezoelectric property of the piezoelectric and/or electrostrictive material and in the adhesion between the piezoelectric and/or electrostrictive material and the lower or upper electrode.

The piezoelectric and/or electrostrictive material preferably has a twin crystal rate within a range from 0.001 to 1.0, and particularly preferably has an orientation property.

Figure 4:
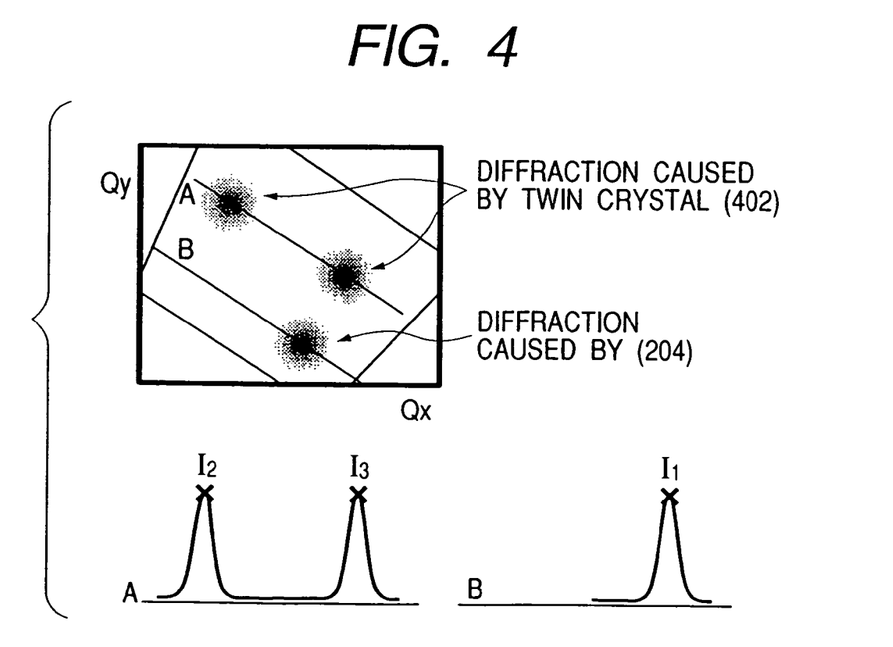
FIG. 4 is a schematic view showing a definition of a twin crystal rate utilizing an inverse lattice space mapping.

The twin crystal rate of the piezoelectric and/or electrostrictive material can be easily determined by a polar point measurement or an inverse lattice space mapping in X-ray diffraction. For example, in case a piezoelectric and/or electrostrictive material of a tetragonal structure of (001) orientation has a twin crystal including a (101) twin crystal plane, in an observation of a non-symmetrical plane such as (204) by an inverse lattice space mapping, there appears, as shown in FIG. 4, a diffraction resulting from (402) of the twin crystal in the vicinity of a diffraction resulting from (204). A twin crystal rate of the piezoelectric and/or electrostrictive material is defined by $(I_2+I_3)/(I_1+I_2+I_3)$ wherein $I_1$ is a peak intensity of the diffraction resulting from (204) while $I_2$ and $I_3$ are peak intensities of the diffractions resulting from (402) of the twin crystal.

Figure 5:
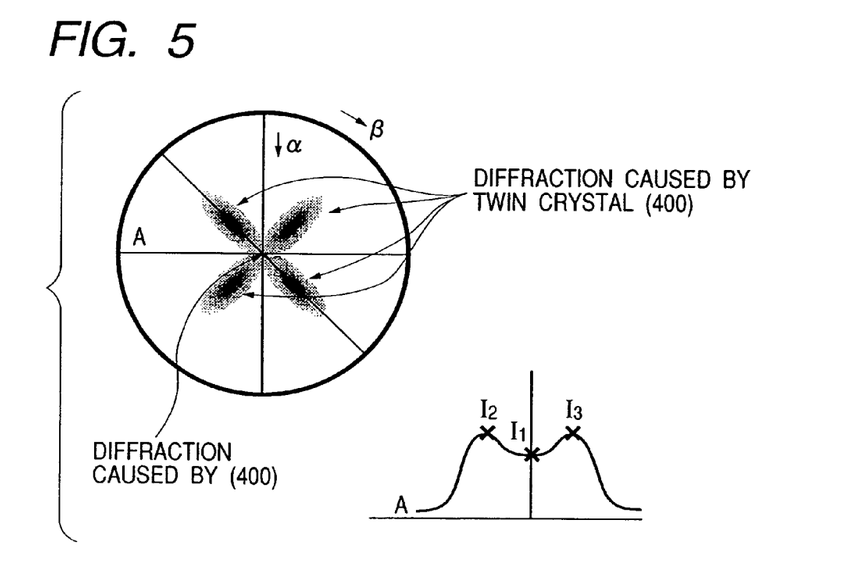
FIG. 5 is a schematic view showing a definition of a twin crystal rate utilizing a polar point measurement.

Similarly, in case a piezoelectric and/or electrostrictive material of a rhombohedral structure of (100) orientation has a twin crystal including a (010) twin crystal plane, in an observation of a symmetrical plane such as (400) by a polar point measurement, there appears, as shown in FIG. 5, a diffraction resulting from (400) of the twin crystal in the vicinity of a diffraction resulting from (400). A twin crystal rate of the piezoelectric and/or electrostrictive material in this case is defined by $(I_2+I_3)/(I_1+I_2+I_3)$ wherein $I_1$ is a peak intensity of the diffraction resulting from (400) while $I_2$ and $I_3$ are peak intensities of the diffractions resulting from (400) of the twin crystal.

As explained in the foregoing, in case the piezoelectric and/or electrostrictive material has a twin crystal, the twin crystal rate can be confirmed by X-ray diffraction, but the presence of the twin crystal in the piezoelectric and/or electrostrictive material can be confirmed, in addition to the aforementioned X-ray diffraction, for example by a cross sectional or surfacial observation with a TEM.

The piezoelectric and/or electrostrictive material preferably has an orientation rate of 90% or higher, more preferably 99% or higher. The piezoelectric and/or electrostrictive material has an orientation property as high as possible, and most preferably has an orientation property in all the axes with an orientation rate of 100%.

The orientation rate of the piezoelectric and/or electrostrictive material can be determined by a $2\theta/\theta$ measurement of X-ray diffraction.

For example, in case a piezoelectric and/or electrostrictive material has a tetragonal structure with [001] orientation, the orientation rate is defined, when the piezoelectric and/or electrostrictive material is so set that a (001) diffraction of tetragonal crystal is most strongly detected, by a proportion of a sum of all the reflection peak intensities resulting from (00L) planes (L=0, 1, 2, ..., n; n being an integer) with respect to a sum of all the reflection peak intensities resulting from the piezoelectric and/or electrostrictive material. However, the twin crystal, including a twin domain, needs only be oriented as a twin crystal and a peak intensity resulting from a twin crystal domain of a twin crystal is not included in the sum of the reflective peak intensities.

A peak intensity resulting from a twin crystal domain of a twin crystal can be simply distinguished from other peak intensities by X-ray diffraction. For example, in case the piezoelectric and/or electrostrictive material has a tetragonal structure with a (101) twin crystal plane, a reflection peak resulting from (001) and a reflection peak resulting from (100) of a twin crystal domain do not appear on a same diffraction point on a same measurement axis in the $2\theta/\theta$ measurement of X-ray diffraction, and can therefore be easily distinguished.

Furthermore, in case the piezoelectric and/or electrostrictive material has an orientation rate of 99% or higher, a reflection peak resulting from (001) and a reflection peak resulting from (100) of a twin crystal domain do not appear on a same diffraction point on a same measurement axis in the 2θ/θ measurement of X-ray diffraction, and can therefore be more easily distinguished. The orientation property in such case can be present along an axis or on all the axes.

Similarly, it is possible to confirm by X-ray diffraction that the piezoelectric and/or electrostrictive material is oriented with an orientation rate of 100% on all the axes. For example, in case a piezoelectric and/or electrostrictive material has a tetragonal structure with a twin crystal plane of (101), an orientation on all the axes with an orientation rate of 100% can be easily confirmed, when the piezoelectric and/or electrostrictive material is so set that a (001) diffraction is most strongly detected in a 2θ/θ measurement of X-ray diffraction, by a fact that only a reflection peak resulting from (00L) planes (L=0, 1, 2, ..., n; n being an integer) of the piezoelectric and/or electrostrictive material is detected in the 2θ/θ measurement of X-ray diffraction and that a non-symmetrical plane such as (204) appears as four-times symmetrical reflection peaks in a polar point measurement of X-ray diffraction. However, the twin crystal, including a twin domain, needs only be oriented as a twin crystal and a reflection peak resulting from a twin crystal domain of a twin crystal may also be confirmed.

A peak intensity resulting from a twin crystal domain of a twin crystal can be simply distinguished from other peak intensities by X-ray diffraction. For example, in case the piezoelectric and/or electrostrictive material has a tetragonal structure with a (101) twin crystal plane, a reflection peak resulting from (001) and a reflection peak resulting from (100) of a twin crystal domain do not appear on a same diffraction point on a same measurement axis in the 2θ/θ measurement of X-ray diffraction, and can therefore be easily distinguished.

Furthermore, in case the piezoelectric and/or electrostrictive material has an orientation property, it is particularly preferred that a principal crystal plane where the piezoelectric and/or electrostrictive material is in contact with the upper electrode is {100}, or that a principal crystal plane where the piezoelectric and/or electrostrictive material is in contact with the upper electrode is {111}, or that a principal crystal plane where the piezoelectric and/or electrostrictive material is in contact with the upper electrode is {110}.

The principal crystal plane indicates an orientation plane of a piezoelectric and/or electrostrictive material having an orientation property, and, for example, a principal crystal plane is (001) in case of a [001] orientation.

Since the piezoelectric and/or electrostrictive material of the present invention has a twin crystal, for example in case of a tetragonal crystal with [001] orientation, [100] is present in a direction inclined by several degrees from [001] by the influence of the twin crystal domain having a (101) twin crystal plane, but a plane in contact with the upper electrode may be in a [001] direction, or in any of four [100] directions, or in a direction between these.

Similarly, for example in a tetragonal crystal with [111] orientation, [111] is split into three directions by the influence of the twin crystal domain. In case of a twin crystal plane of (101), the split directions are inclined by several degrees mutually, and the plane in contact with the upper electrode may be present in any of such three [111] directions or between such directions.

Similarly, for example in a rhombohedral crystal with [100] orientation, [100] is split into four directions by the influence of the twin crystal domain. In case of a twin crystal plane of (100), the split directions are inclined by several degrees mutually, and the plane in contact with the upper electrode may be present in any of such four [100] directions or between such directions.

Similarly, for example in a rhombohedral crystal with [111] orientation, [-111] is present in a direction inclined by several degrees from [111] by the influence of the twin crystal domain having a (100) twin crystal plane, but the plane in contact with the upper electrode may be present in a [111] direction or in any of such three [-111] directions or between such directions.

Thus, in case the piezoelectric and/or electrostrictive material has a twin crystal, the principal crystal plane in contact with the upper electrode may be in the orienting direction of the crystal, or in any of the orienting directions split by the twin crystal, or between such directions, and therefore has a range of inclination of several degrees.

The piezoelectric element of the present invention is particularly preferably formed directly on the substrate, as the piezoelectric element can be miniaturized. The piezoelectric element is preferably formed by utilizing, a film forming process for direct formation, a film forming method such as a sol-gel method, a hydrothermal synthesis method, a gas deposition method or an electrophoresis method, or a vacuum film forming method such as a sputtering method, a CVD method, an MOCVD method, an ion beam deposition method, a molecular beam epitaxial method or a laser ablation method. Such film forming methods further facilitate control of crystal orientation of the piezoelectric and/or electrostrictive material utilizing the crystalline property of the substrate or the lower electrode, or achievement of a higher orientation of the piezoelectric and/or electrostrictive material utilizing an epitaxial growth.

Also as the piezoelectric element of the present invention is preferably formed directly on the substrate, the piezoelectric and/or electrostrictive material preferably has a thickness of 1 to 10 μm, more preferably 1 to 5 μm. In a piezoelectric element formed directly on a substrate with a thin film process with a thickness of the piezoelectric and/or electrostrictive material of 10 μm or larger, because of difficulties such as a film peeling even if the piezoelectric and/or electrostrictive material has a twin crystal structure, it is considered difficult to obtain a piezoelectric element of a high orientation property for all the aforementioned piezoelectric and/or electrostrictive materials.

A substrate to be employed in such case is preferably a single crystal substrate such as Si, $SrTiO_3$, $(La, Sr)TiO_3$, MgO, $Al_2O_3$, $SrRuO_3$, RuO or Pt, particularly a single crystal substrate such as $SrTiO_3$, $(La, Sr)TiO_3$, MgO or $SrRuO_3$ having a lattice constant close to that of a lead-based piezoelectric film such as PZT or PLZT showing an excellent ferroelectric property or of an electrostrictive material such as PZN-PT. However, a Si substrate is preferred as a substrate for example because a large area can be easily obtained. Also in case of employing for example a Si substrate, either by controlling an intermediate layer between the substrate and the piezoelectric and/or electrostrictive material, or utilizing a natural orientation of a Pt electrode often employed as the electrode, or controlling a film forming condition of the electrode, it is possible to achieve a single crystal state and a high orientation in the piezoelectric and/or electrostrictive material, thereby providing a piezoelectric element of an even higher piezoelectric property. Similarly there can also be employed a non-single crystalline substrate such as of glass or stainless steel.

An actuator 10 of an ink jet recording head M, illustrated in the embodiment of the present invention shown in FIGS. 1 to 3, is a piezoelectric actuator of unimorph vibrator type. In this case, the piezoelectric actuator is constituted of a piezoelectric element 15 and a vibrating plate 11, which is preferably constituted of a semiconductor such as silicon, a metal, a metal oxide or a glass. The aforementioned piezoelectric element may be adjoined or adhered to the vibrating plate, or the lower electrode and the piezoelectric and/or electrostrictive material may be formed directly on the vibrating plate constituting the substrate. It is also possible to directly form the vibrating plate on the substrate. Furthermore, the substrate and the main body substrate 1 may be a same member or different. In the actuator 10 of an ink jet recording head M, illustrated in the embodiment of the present invention shown in FIGS. 1 to 3, the vibrating plate 11 preferably has a Young's modulus of 10 to 300 GPa, and a thickness of 10 μm or less.

The piezoelectric actuator may have various other forms, but, for example in an ink jet recording head utilizing a laminated vibrator, the vibrating plate preferably has a thickness of 200 μm or less. The material and the physical properties of the vibrating plate can be suitably selected according to the purpose of the piezoelectric actuator. Also the aforementioned piezoelectric element may be utilized, in addition to the aforementioned piezoelectric actuator for the ink jet recording head, for a piezoelectric actuator of a micropump, an ultrasonic motor, an ultrasonic vibrator, a piezoelectric transformer, a frequency filter, a piezoelectric sensor, a piezoelectric speaker, a piezoelectric relay, a micromachine, a micromirror device etc.

By directly forming all of a vibrating plate, a lower electrode, a piezoelectric member and an upper electrode or a part thereof in succession on a substrate with a thin film process, it is possible to reduce the fluctuation in performance of the piezoelectric actuators of the nozzles of the ink jet recording head, to obtain a satisfactory adhesion with the lower or upper electrode, and to achieve a miniaturization and a high density of the piezoelectric elements. Also the piezoelectric property of the piezoelectric element can be further improved by employing a piezoelectric and/or electrostrictive material, so that a further miniaturization or a higher density can be achieved in the piezoelectric elements. Therefore, the present embodiment is particularly preferable for an ink jet recording head.

In the following there will be given a detailed explanation on a piezoelectric element of the present embodiment, and an actuator and an ink jet recording head utilizing the same, with reference to accompanying drawings.

EXAMPLE 1, COMPARATIVE EXAMPLE 1

A procedure of producing a piezoelectric element of Example 1 is as follows.

Figure 6:
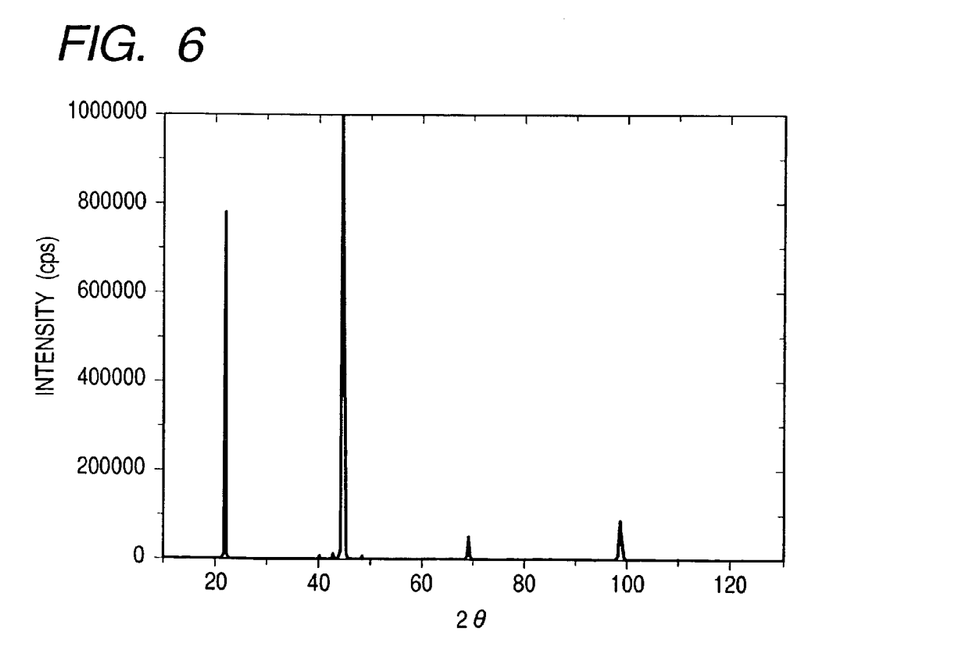
FIG. 6 is an XRD profile (2θ/θ measurement) of Example 1 of the present invention.
Figure 7:
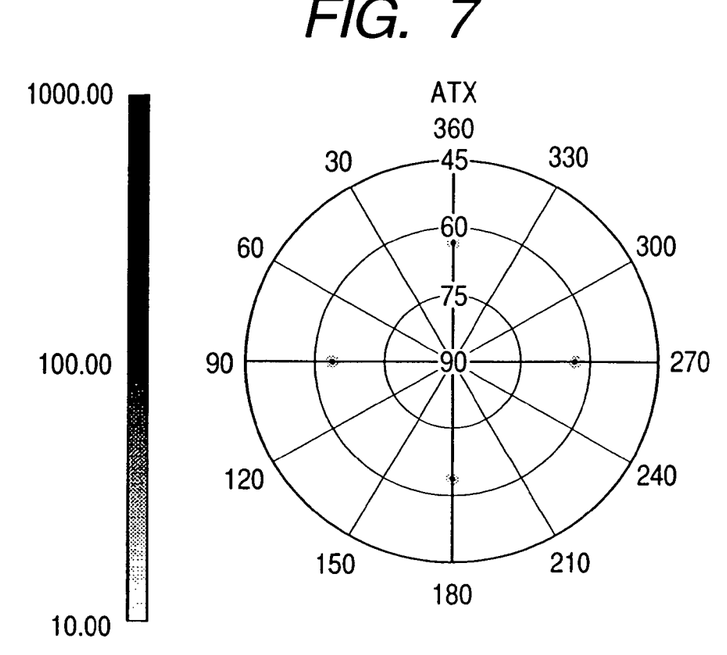
FIG. 7 is an XRD profile ((204) positive polar point) of Example 1 of the present invention.
Figure 8:
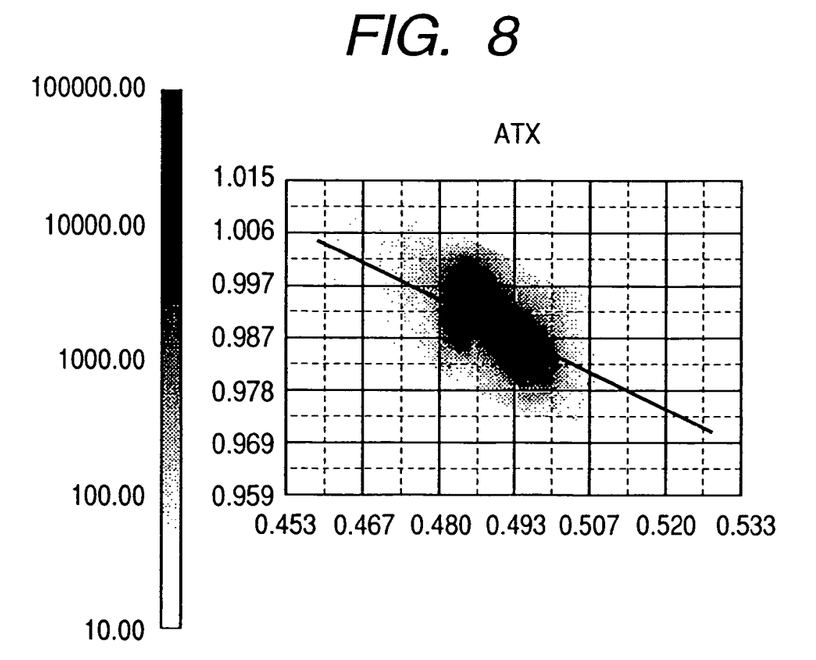
FIG. 8 is an XRD profile ((204) inverse lattice mapping) of Example 1 of the present invention.

A monocrystalline electrostrictive material PZN-PT [0.91[Pb(Zn$_{1/3}$Nb$_{2/3}$)O$_3$]-0.09[PbTiO$_3$]] was prepared by a flux method, and the crystal was cut out into a thin plate of a thickness of 300 μm in such a manner that a principal crystal plane coming into contact with the upper or lower electrode became (001). Such electrostrictive material was subjected to an X-ray diffraction with a multi-axis X-ray diffraction apparatus Rint-Inplane, manufactured by Rigaku Co. A 2θ/θ measurement detected, as shown in FIG. 6, only reflection peaks resulting from (00L) planes (L=1, 2, 3, . . . , n: n being an integer). Also a positive polar point measurement of a non-symmetrical plane (204) showed, as shown in FIG. 7, reflection peaks in 4-times symmetry. As a result, it was confirmed that the thin plate of the electrostrictive material PZN-PT was oriented in all the axes with an orientation rate of 100%. Also an inverse lattice space mapping of (204) confirmed, as shown in FIG. 8, that the electrostrictive material PZN-PT of Example 1 was a tetragonal crystal having a twin crystal with a twin crystal plane of (101) and a twin crystal rate of about 0.6.

Pt/Ti electrodes were formed by sputtering on and under the thin plate to obtain a piezoelectric element of Example 1.

A procedure of producing a piezoelectric element of Comparative Example 1 is as follows.

Figure 9:
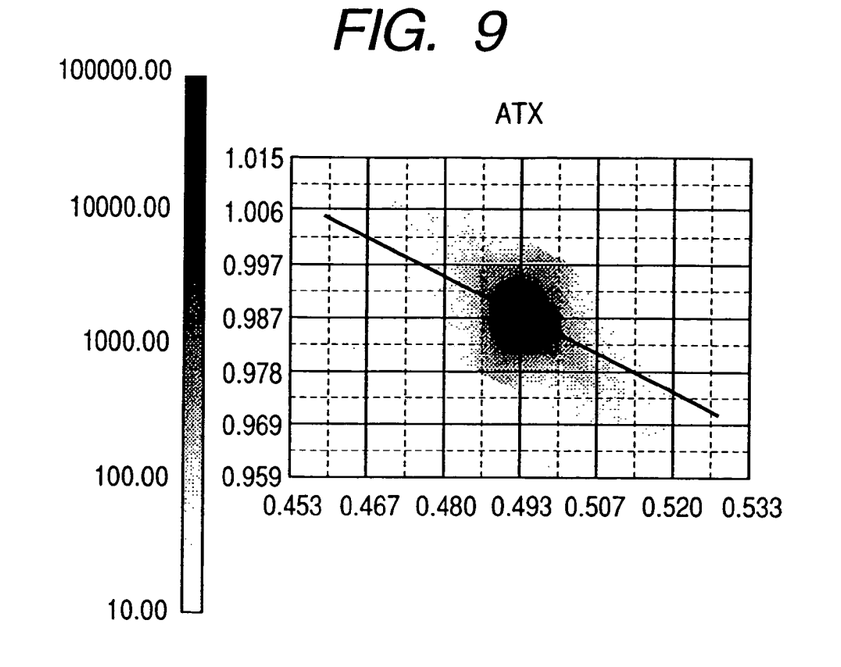
FIG. 9 is an XRD profile ((204) inverse lattice mapping) of Comparative Example 1 of the present invention.
Figure 10:
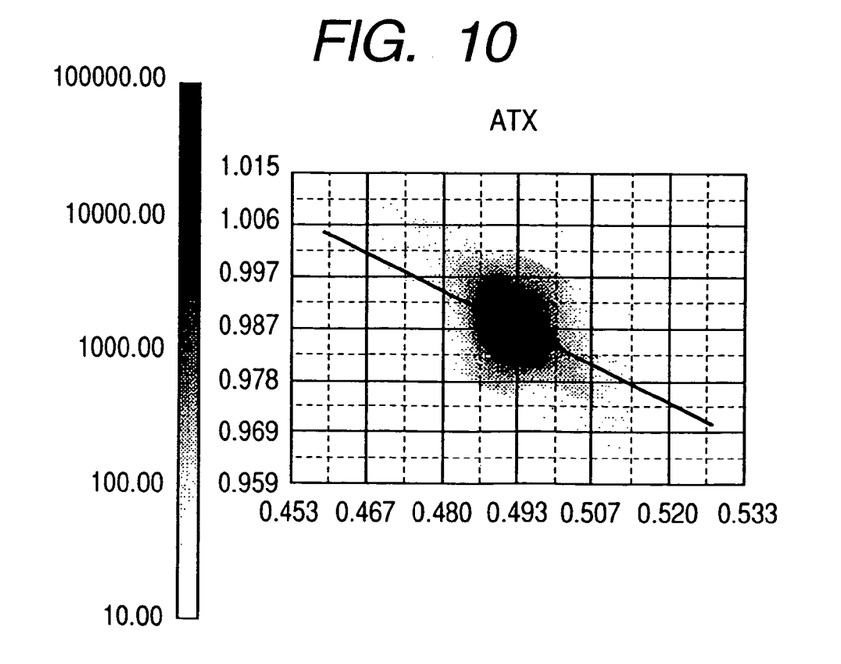
FIG. 10 is an XRD profile ((−204) inverse lattice mapping) of Comparative Example 1 of the present invention.

A monocrystalline electrostrictive material PZN-PT [0.91[Pb(Zn$_{1/3}$Nb$_{2/3}$)O$_3$]-0.09[PbTiO$_3$]] was prepared by a flux method with a temperature condition different from that of Example 1, and the crystal was cut out into a thin plate of a thickness of 300 μm in such a manner that a principal crystal plane coming into contact with the upper or lower electrode became (001). Such electrostrictive material was subjected to an X-ray diffraction. A 2θ/θ measurement detected only reflection peaks resulting from (00L) planes (L=1, 2, 3, . . . , n: n being an integer). Also a positive polar point measurement of a non-symmetrical plane (204) showed reflection peaks in 4-times symmetry. As a result, it was confirmed that the thin plate of the electrostrictive material PZN-PT was oriented in all the axes with an orientation rate of 100%. Also an inverse lattice space mapping of (204) and (−204) confirmed, as shown in FIGS. 9 and 10, that the electrostrictive material PZN-PT of Comparative Example 1 was a tetragonal crystal without a twin crystal.

Then Pt/Ti electrodes were formed by sputtering on and under the thin plate to obtain a piezoelectric element of Comparative Example 1.

Table 1 shows results of a piezoelectric constant measurement of the piezoelectric elements of Example 1 and Comparative Example 1.

TABLE 1

|  | Example 1 | Comp. Ex. 1 |
| --- | --- | --- |
| Twin crystal (twin rate) | present (1.0) | absent |
| Piezoelectric constant (pC/N) | 2500 | 1800 |

As a result, it was confirmed that Example 1 was extremely better in the piezoelectric constant in comparison with Comparative Example 1.

EXAMPLES 2, 3, COMPARATIVE EXAMPLE 2

A procedure of producing a piezoelectric element of Example 2 is as follows.

On a La-doped SrTiO$_3$ (100) substrate serving also as a lower electrode, a piezoelectric material PZN [Pb(Zr$_{0.55}$Ti$_{0.45}$)O$_3$] was prepared with a thickness of 3 μm by a MO-CVD method at a substrate temperature of 400° C. or higher, and the piezoelectric material PZT was subjected to an X-ray diffraction. A 2θ/θ measurement detected only reflection peaks resulting from (00L) planes (L=1, 2, 3, . . . , n: n being an integer). Also a positive polar point measurement of a non-symmetrical plane (204) provided reflection peaks in 4-times symmetry. As a result, it was confirmed that the piezoelectric PZT film was oriented in all the axes with an orientation rate of 100%. Also a positive polar point measurement of a symmetrical plane (004) provided a diffraction pattern as schematically shown in FIG. 5, and an inverse lattice space mapping of (204) showed a diffraction point of PZT on an α-axis substantially same as that of the substrate. As a result, it was confirmed that the piezoelectric material PZN of Example 2 was a rhombohedral crystal having a twin crystal with a twin crystal plane of (100) and a twin crystal rate of about 0.8.

Then a Pt/Ti electrode was prepared on the film to obtain a piezoelectric element of Example 2.

A procedure of producing a piezoelectric element of Example 3 is as follows.

On a La-doped SrTiO$_3$ (100) substrate serving also as a lower electrode, a piezoelectric material PZN [Pb(Zr$_{0.45}$Ti$_{0.55}$)O$_3$] was prepared with a thickness of 3 μm by a MO-CVD method at a substrate temperature of 400° C. or higher, and the piezoelectric material was subjected to an X-ray diffraction. A 2θ/θ measurement detected only reflection peaks resulting from (00L) planes (L=1, 2, 3, . . . , n: n being an integer). Also a positive polar point measurement of a non-symmetrical plane (204) provided reflection peaks in 4-times symmetry. As a result, it was confirmed that the piezoelectric PZT film was oriented in all the axes with an orientation rate of 100%. Also an inverse lattice space mapping of (204) provided a diffraction pattern as schematically shown in FIG. 4. As a result, it was confirmed that the piezoelectric material PZN of Example 3 was a tetragonal crystal having a twin crystal with a twin crystal plane of (101) and a twin crystal rate of about 0.01.

Then a Pt/Ti electrode was prepared on the film to obtain a piezoelectric element of Example 3.

A procedure of producing a piezoelectric element of Comparative Example 2 is as follows.

On a La-doped SrTiO$_3$ (111) substrate serving also as a lower electrode, a piezoelectric material PZN [Pb(Zr$_{0.58}$Ti$_{0.42}$)O$_3$] was prepared with a thickness of 3 μm for example by a sputtering method at a substrate temperature of 400° C. or higher, and the piezoelectric material was subjected to an X-ray diffraction. A 2θ/θ measurement detected only reflection peaks resulting from (00L) planes (L=1, 2, 3, . . . , n: n being an integer). Also a positive polar point measurement of a non-symmetrical plane (204) provided reflection peaks in 3-times symmetry. As a result, it was confirmed that the piezoelectric PZT film was monocrystalline. Also a positive polar point measurement of a symmetrical plane (004) provided only one concentric diffraction pattern on α=90°, and an inverse lattice space mapping of (204) showed a diffraction point of PZT on an α-axis substantially same as that of the substrate. As a result, it was confirmed that the piezoelectric material PZN of Comparative Example 2 was a rhombohedral crystal without a twin crystal.

Then a Pt/Ti electrode was prepared on the film to obtain a piezoelectric element of Comparative Example 2.

Table 2 shows results of a piezoelectric constant measurement of the piezoelectric elements of Examples 2 and 3 and Comparative Example 2.

TABLE 2

|  | Example 2 | Example 3 | Comp. Ex. 2 |
|---|---|---|---|
| Twin crystal (twin crystal rate) | present (1.0) | present (0.01) | absent |
| Piezoelectric constant (pC/N) | 600 | 500 | 300 |

As a result, it was confirmed that Examples 2 and 3 were extremely better in the piezoelectric constant in comparison with Comparative Example 2.

EXAMPLE 4, COMPARATIVE EXAMPLE 3

A procedure of producing piezoelectric elements of Example 4 and Comparative Example 3 is as follows.

At first, on a main body substrate (Si substrate) constituting a substrate, a film of a vibrating plate was formed by sputtering. In this operation, the film formation was conducted under heating of the substrate at a temperature of 500° C. or higher, whereby the vibrating plate showed a crystal growth and was oriented in a single direction. A film of a lower electrode was formed in a similar method on the vibrating plate, thereby obtaining a crystal film of a high orientation. Also a film of a piezoelectric and/or electrostrictive material was formed on the lower electrode whereby a piezoelectric and/or electrostrictive material of a high orientation was obtained. An upper electrode was formed also by sputtering.

Then a wet anisotropic etching was conducted on the Si substrate to eliminate a central part from the rear side, thereby providing a piezoelectric actuator shown in FIG. 2. A vibrating portion of each piezoelectric actuator had a length of 5000 μm and a width of 200 μm.

In the piezoelectric actuator of Example 4, it was confirmed that the piezoelectric and/or electrostrictive material had a twin crystal. Also in the piezoelectric actuator of Comparative Example 3, it was confirmed that the piezoelectric and/or electrostrictive material did not have a twin crystal.

Example 4 and Comparative Example 3 had layer compositions and thicknesses shown in the following, wherein ( ) indicates a preferential direction of orientation and [ ] indicates a film thickness:

upper electrode Pt [0.25 μm]/Ti [0.05 μm]//piezoelectric material PZT (001) [3 μm]//lower electrode Pt [0.5 μm]/Ti [0.05 μm]/vibrating plate YSZ (100) [2 μm]/substrate Si (100) [600 μm]; wherein PZT had a composition Zr/Ti of 65/35, and YSZ indicates yttria-stabilizxed zirconia.

Table 3 shows presence/absence of twin crystal in the piezoelectric material PZT in Example 4 and Comparative Example 3, a maximum displacement when an amplitude of vibration is increased under an increasing application of a frequency of 10 kHz to each piezoelectric actuator, and a result of cross-cut peeling test.

TABLE 3

|  | Example 4 | Comp. Ex. 3 |
|---|---|---|
| Twin crystal | present | absent |
| Displacement (μm) | 0.45 | 0.25 |
| Peeling test | excellent | no bad but no good |

As a result, it was confirmed that the piezoelectric actuator of Example 4 had a larger displacement and a higher adhesion in comparison with Comparative Example 3.

EXAMPLE 5, COMPARATIVE EXAMPLE 4

The piezoelectric actuators of Example 4 and Comparative Example 3 were respectively used to prepare ink jet recording heads shown in FIG. 3 as Example 5 and Comparative Example 4.

Referring to FIG. 3, the vibrating plate, the lower electrode, the piezoelectric and/or electrostrictive material and the upper electrode laminated on the main body substrate had film thicknesses, as explained in the foregoing, of upper electrode 0.3 μm/piezoelectric and/or electrostrictive material 3 μm/lower electrode 0.5 μm/vibrating plate 2 μm/substrate 600 μm. Also the pressure chamber had a width of 90 μm and a wall thickness of 50 μm, and the liquid discharge ports had a density of 180 dpi.

The piezoelectric actuator was prepared, as explained in the foregoing, by forming a vibrating plate by sputtering on the Si substrate constituting the main body substrate.

In this operation, the film formation was conducted under heating of the substrate at a temperature of 500° C. or higher, whereby the vibrating plate showed a crystal growth and was oriented in a single direction. A film of a lower electrode was formed in a similar method on the vibrating plate, whereby a crystal film of a high orientation was obtained. Also a film of a piezoelectric and/or electrostrictive material was formed on the lower electrode whereby a piezoelectric and/or electrostrictive material of a high orientation was obtained. An upper electrode was formed also by sputtering.

Then ICP was utilized to form pressure chambers and liquid supply paths on the Si substrate, and a nozzle plate provided with liquid discharge ports was adjoined respectively corresponding to the pressure chambers, thereby producing an ink jet recording head. In the piezoelectric actuator of Example 5, it was confirmed that the piezoelectric and/or electrostrictive material had a twin crystal. Also in the piezoelectric actuator of Comparative Example 4, it was confirmed that the piezoelectric and/or electrostrictive material did not have a twin crystal.

Table 4 shows a discharge amount and a discharge speed of a liquid droplet in the ink jet recording heads of Example 5 and Comparative Example 4 under a signal application of 20 V and 10 kHz.

TABLE 4

|  | Example 5 | Comp. Ex. 4 |
| --- | --- | --- |
| Twin crystal | present | absent |
| Discharge amount (pl) | 19 | 15 |
| Discharge speed (m/sec) | 15 | 12 |

As a result, Example 5 under an application of 20 V (10 kHz) showed a discharge amount of 19 pl and a discharge speed of 15 m/sec. On the other hand, Comparative Example 4 showed a discharge amount of 15 pl and a discharge speed of 12 m/sec, so that the discharge performance was evidently improved by the presence of the twin crystal.

Also in a durability test, the ink jet recording head of Comparative Example 4 showed a peeling and developed non-discharging nozzles after $10^7$ to $10^8$ discharges. On the other hand, the ink jet recording head of Example 5 did not show non-discharging nozzles even after $10^8$ discharges.

The invention claimed is:

1. A piezoelectric member element including an upper electrode, a piezoelectric member constituted by a piezoelectric and/or electrostrictive material and a lower electrode, wherein said piezoelectric member is a complex oxide constituted by the general formula $ABO_3$ and is formed on said lower electrode as a thin film having a thickness of 1 to 10 μm, and wherein said piezoelectric member has a twin crystal.

2. A piezoelectric actuator employing a piezoelectric member element according to claim 1.

3. An ink jet recording head employing a piezoelectric member element according to claim 1.

4. A method for manufacturing a piezoelectric member element including an upper electrode, a piezoelectric member having a twin crystal and a lower electrode, the piezoelectric member being constituted by a piezoelectric and/or electrostrictive material, said method comprising the steps of:

forming the piezoelectric member as a thin film having a thickness of 1 to 10 μm on the lower electrode by directly supplying a material for the piezoelectric member to the lower electrode; and forming the upper electrode on the thin film piezoelectric member.

5. A method according to claim 4, wherein said step of forming the thin film piezoelectric member is performed by a sol-gel method, a hydrothermal synthesis method, a gas deposition method, an electrophoresis method, a sputtering method, a CVD method, an MOCVD method, an ion beam deposition method, a molecular beam epitaxy method or a laser ablation method.

6. A method according to claim 5, wherein said step of forming the thin film piezoelectric member is performed by a sputtering method or an MOCVD method, and a substrate on which the lower electrode is formed is maintained at a temperature of 400° C. or higher during said step of forming the thin film piezoelectric member.

7. A method according to claim 6, wherein in said step of forming the thin film piezoelectric member, a temperature change of the substrate is controlled to be no more than 10%.

8. A method according to claim 6, wherein in said step of forming the thin film piezoelectric member, a distance between the substrate and a target of the material of said piezoelectric member is changed.

* * * * *